(12) United States Patent
Kim et al.

(10) Patent No.: US 9,257,630 B2
(45) Date of Patent: Feb. 9, 2016

(54) MULTILAYER PIEZOELECTRIC DEVICE WITH POLYCRYSTALLINE AND SINGLE CRYSTAL MEMBERS AND INTERMEDIATE MEMBER PROVIDED BETWEEN THE POLYCRYSTALLINE MEMBER AND THE SINGLE CRYSTAL MEMBER

(71) Applicant: SAMSUNG ELECTRO-MECHANICS CO., LTD., Suwon-si, Gyeonggi-do (KR)

(72) Inventors: Boum Seock Kim, Suwon-si (KR); Jung Wook Seo, Suwon-si (KR)

(73) Assignee: SAMSUNG ELECTRO-MECHANICS CO., LTD., Suwon, Gyeonggi-Do (KR)

( * ) Notice: Subject to any disclaimer, the term of this patent is extended or adjusted under 35 U.S.C. 154(b) by 185 days.

(21) Appl. No.: 14/072,733

(22) Filed: Nov. 5, 2013

(65) Prior Publication Data
US 2015/0022057 A1 Jan. 22, 2015

(30) Foreign Application Priority Data

Jul. 16, 2013 (KR) .......................... 10-2013-0083564

(51) Int. Cl.
*H01L 41/083* (2006.01)
*F02M 51/06* (2006.01)
*H01L 41/273* (2013.01)

(52) U.S. Cl.
CPC .......... *H01L 41/083* (2013.01); *F02M 51/0603* (2013.01); *H01L 41/273* (2013.01); *F02M 2200/21* (2013.01)

(58) Field of Classification Search
CPC ..................................................... H01L 41/083
USPC ......................................................... 310/328
See application file for complete search history.

(56) References Cited

U.S. PATENT DOCUMENTS

| | | | | |
|---|---|---|---|---|
| 6,353,278 B1* | 3/2002 | Fujii | .................. | H01L 41/083 310/323.09 |
| 2002/0000762 A1* | 1/2002 | Steinkopff | ............ | H01L 41/083 310/328 |
| 2005/0188916 A1* | 9/2005 | Riman | .................. | C01G 23/003 117/21 |
| 2005/0206274 A1* | 9/2005 | Kobane | .................. | H01L 41/273 310/328 |
| 2010/0001620 A1* | 1/2010 | Yuuya | .................... | B06B 1/0629 310/336 |
| 2015/0028726 A1* | 1/2015 | Kim | ..................... | H01L 41/0474 310/365 |
| 2015/0115480 A1* | 4/2015 | Peidous | ............ | H01L 21/76251 257/798 |

FOREIGN PATENT DOCUMENTS

| | | | | | |
|---|---|---|---|---|---|
| DE | 4029972 A1 | * | 3/1992 | ............ | H01L 41/083 |
| JP | 02107577 A | * | 4/1990 | | |
| JP | 02199094 A | * | 8/1990 | | |
| JP | 03255603 A | * | 11/1991 | | |
| JP | 2003-046160 A | | 2/2003 | | |

* cited by examiner

*Primary Examiner* — J. San Martin
(74) *Attorney, Agent, or Firm* — McDermott Will & Emery LLP

(57) ABSTRACT

The present invention relates to a piezoelectric device. A piezoelectric device in accordance with an embodiment of the present invention includes a piezoelectric member and a connection member which are coupled to each other, wherein the piezoelectric member includes a polycrystalline member made of a polycrystalline piezoelectric material, a single crystal member made of a single crystal piezoelectric material and coupled to the connection member, and a textured member provided between the polycrystalline member and the single crystal member and having intermediate properties of the polycrystalline piezoelectric material and the single crystal piezoelectric material.

7 Claims, 3 Drawing Sheets

MULTILAYER PIEZOELECTRIC DEVICE WITH POLYCRYSTALLINE AND SINGLE CRYSTAL MEMBERS AND INTERMEDIATE MEMBER PROVIDED BETWEEN THE POLYCRYSTALLINE MEMBER AND THE SINGLE CRYSTAL MEMBER

CROSS-REFERENCE TO RELATED APPLICATIONS

Claim and incorporate by reference domestic priority application and foreign priority application as follows:
CROSS REFERENCE TO RELATED APPLICATION
This application claims the benefit under 35 U.S.C. Section 119 of Korean Patent Application Serial No. 10-2013-0083564, entitled filed Jul. 16, 2013, which is hereby incorporated by reference in its entirety into this application.

BACKGROUND OF THE INVENTION

1. Field of the Invention

The present invention relates to a piezoelectric device, and more particularly, to a piezoelectric device having a structure resistant to external physical or mechanical shocks and a method for manufacturing the same, and a driven assembly with the piezoelectric device.

2. Description of the Related Art

A piezoelectric device can generate a mechanical displacement according to structural deformation caused by a dipole formed inside ceramic due to an electric field between two electrodes when a voltage is applied from the outside. The piezoelectric device is mainly used in various types of actuator applications that should use a displacement. For example, the actuator applications may be a fuel injector, a nano-positioning system, an inkjet head, etc.

Since the displacement of the piezoelectric device increases in proportion to the electric field, a higher voltage should be applied between the electrodes to obtain a larger displacement. However, generation of a high voltage as an operating voltage may cause a huge problem in circuits. Thus, usually, a piezoelectric material is implemented in the form of a multilayer structure in which the thickness between electrodes is reduced to generate a large displacement through a higher electric field even in a low voltage. For example, when the same voltage is applied to a multilayer piezoelectric material having nine layers and a single-layer piezoelectric material, an electric field applied to the multilayer piezoelectric material can generate a displacement nine times larger than that of the single-layer piezoelectric material.

Meanwhile, ultrahigh multilayer piezoelectric actuators such as a fuel injector and a nano-positioning system are all exposed to physical and mechanical shocks, and most of the damages due to the physical or mechanical shocks are concentrated on the coupling portion between a polycrystalline piezoelectric material and an external connection member connected thereto. However, since the polycrystalline piezoelectric material itself is vulnerable to external shocks, it is very difficult to implement a piezoelectric device that is resistant to external shocks.

RELATED ART DOCUMENT

Patent Document

Patent Document 1: Japanese Patent Laid-open No. 2003-046160

SUMMARY OF THE INVENTION

The present invention has been invented in order to overcome the above-described problems and it is, therefore, an object of the present invention to provide a piezoelectric device resistant to physical or mechanical shocks and a method for manufacturing the same, and a driven assembly with the piezoelectric device, particularly a piezoelectric device having a structure in which a coupling portion between a piezoelectric material and a connection member is resistant to external shocks and a method for manufacturing the same, and a driven assembly with the piezoelectric device.

It is another object of the present invention to provide a piezoelectric device that is resistant to physical or mechanical shocks while minimizing price rises and a method for manufacturing the same, and a driven assembly with the piezoelectric device.

In accordance with one aspect of the present invention to achieve the object, there is provided a piezoelectric device including a piezoelectric member and a connection member coupled to the piezoelectric member, wherein the piezoelectric member includes a polycrystalline member made of a polycrystalline piezoelectric material, a single crystal member made of a single crystal piezoelectric material and coupled to the connection member, and a textured member provided between the polycrystalline member and the single crystal member and having intermediate properties of the polycrystalline piezoelectric material and the single crystal piezoelectric material.

In accordance with an embodiment of the present invention, the polycrystalline member may have a multilayer structure with the number of layers greater than those of the single crystal member and the textured member.

In accordance with an embodiment of the present invention, the single crystal member may have a single-layer structure, and the polycrystalline member may have a multilayer structure.

In accordance with an embodiment of the present invention, the polycrystalline member may occupy more than 90% of the entire area of the piezoelectric member.

In accordance with an embodiment of the present invention, the textured member may have a crystal orientation closer to that of the single crystal member than that of the polycrystalline piezoelectric material.

In accordance with an embodiment of the present invention, the single crystal member may have a crystal orientation of d33, and the textured member may have a crystal orientation closer to that of d33 than that of the polycrystalline member.

In accordance with an embodiment of the present invention, the textured member may be formed by disposing the polycrystalline piezoelectric material adjacent to the single crystal member and firing the polycrystalline piezoelectric material to change the crystal orientation of the polycrystalline piezoelectric material adjacent to the single crystal member.

In accordance with another aspect of the present invention to achieve the object, there is provided a method for manufacturing a piezoelectric device, including: preparing a polycrystalline piezoelectric layer using a polycrystalline piezoelectric material; preparing a single crystal piezoelectric layer using a single crystal piezoelectric material; manufacturing a multilayer piezoelectric structure by laminating the polycrystalline piezoelectric layer on the single crystal piezoelectric layer; and forming a composite piezoelectric structure consisting of a single crystal member, a polycrystalline member, and a textured member provided between the polycrystalline member and the single crystal member and having intermediate properties of the polycrystalline piezoelectric material and the single crystal piezoelectric material by firing the multilayer piezoelectric structure.

In accordance with an embodiment of the present invention, the step of preparing the single crystal piezoelectric layer may be performed by forming the sintered single crystal piezoelectric layer, and the step of preparing the crystalline piezoelectric layer may be performed by forming a laminate of the non-sintered polycrystalline piezoelectric layers.

In accordance with an embodiment of the present invention, the step of preparing the polycrystalline piezoelectric layer may include the step of manufacturing the multilayer piezoelectric structure having the number of layers greater than that of the single crystal piezoelectric layer.

In accordance with an embodiment of the present invention, the textured member may have a crystal orientation closer to that of the single crystal member than that of the polycrystalline piezoelectric material.

In accordance with an embodiment of the present invention, the method for manufacturing a piezoelectric device may further include the step of connecting the textured member of the piezoelectric member to a connection member.

In accordance with another aspect of the present invention to achieve the object, there is provided a driven assembly including: a nozzle member for discharging fuel; a valve for controlling fuel supply to the nozzle member; and a driving member for controlling driving of the value, wherein the driving member may include a piezoelectric device having a piezoelectric member and a connection member, and the piezoelectric member may include a polycrystalline member made of a polycrystalline piezoelectric material, a single crystal member made of a single crystal piezoelectric material and coupled to the connection member, and a textured member provided between the polycrystalline member and the single crystal member and having intermediate properties of the polycrystalline piezoelectric material and the single crystal piezoelectric material.

In accordance with another aspect of the present invention to achieve the object, there is provided a driven assembly including: a workpiece; a sensing member for sensing the position of the workpiece; and a driving member for changing the position of the workpiece, wherein the driving member may include a piezoelectric device having a piezoelectric member and a connection member, and the piezoelectric member may include a polycrystalline member made of a polycrystalline piezoelectric material, a single crystal member made of a single crystal piezoelectric material and coupled to the connection member, and a textured member provided between the polycrystalline member and the single crystal member and having intermediate properties of the polycrystalline piezoelectric material and the single crystal piezoelectric material.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
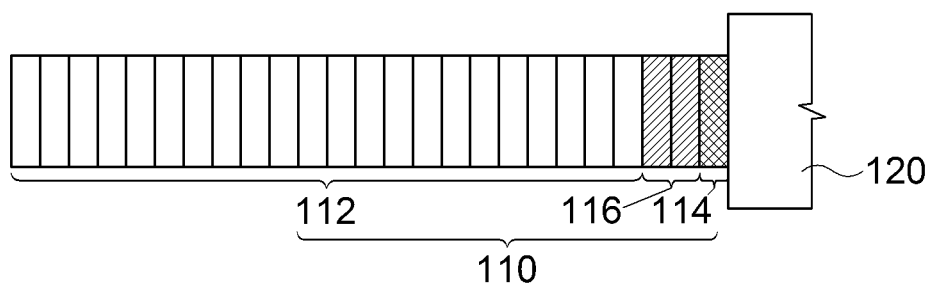
FIG. 1 is a view showing a piezoelectric device in accordance with an embodiment of the present invention.

Advantages and features of the present invention and methods of accomplishing the same will be apparent by referring to embodiments described below in detail in connection with the accompanying drawings. However, the present invention is not limited to the embodiments disclosed below and may be implemented in various different forms. The embodiments are provided only for completing the disclosure of the present invention and for fully representing the scope of the present invention to those skilled in the art. Like reference numerals refer to like elements throughout the specification.

Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Further, embodiments to be described throughout the specification will be described with reference to cross-sectional views and/or plan views, which are ideal exemplary drawings of the present invention. In the drawings, the thicknesses of layers and regions may be exaggerated for the effective explanation of technical contents. Therefore, the exemplary drawings may be modified by manufacturing techniques and/or tolerances. Therefore, the embodiments of the present invention are not limited to the accompanying drawings, and can include modifications to be generated according to manufacturing processes. For example, an etched region shown at a right angle may be formed in the rounded shape or formed to have a predetermined curvature.

Hereinafter, a piezoelectric device and a driven assembly with the same in accordance with an embodiment of the present invention will be described in detail with reference to the accompanying drawings.

FIG. 1 is a view showing a piezoelectric device in accordance with an embodiment of the present invention. Referring to FIG. 1, a piezoelectric device 100 according to an embodiment of the present invention may include a piezoelectric member 110 and a connection member 120, and the piezoelectric member 110 may include a polycrystalline member 112, a single crystal member 114, and a textured member 116.

The piezoelectric member 110 may be a piezoelectric structure having the shape of a column generally long in one direction. As an example, the piezoelectric member 110 may be a multilayer piezoelectric structure consisting of thin films of at least one selected from lead zirconium titanate (PZT), barium titanate (BaTiO3), barium strontium titanate (Ba,Sr)(TiO3), lead magnesium niobate (PMN), lead titanate (PT), and solid solutions thereof, and a relaxor ferroelectric. The above thin films may be single crystal ferroelectric thin films or polycrystalline ferroelectric films having no in-plane orientation and oriented in the direction normal to the substrate.

The polycrystalline member 112 may be one-side area of the piezoelectric member 110 made of a polycrystalline piezoelectric material, the single crystal member 114 may be the other side area of the piezoelectric member 110 made of a single crystal piezoelectric material, and the textured member 116 may be made of a piezoelectric material having intermediate properties of poly crystal or single crystal and may be an intermediate area provided between the polycrystalline member 112 and the single crystal member 114.

The polycrystalline member 112 may have a multilayer structure with the number of layers relatively greater than that of the single crystal member 114. For example, the polycrystalline member 112 may have a multilayer piezoelectric structure formed by laminating sheets made of a polycrystalline piezoelectric material. On the contrary, the single crystal member 114 may have a multilayer structure with the number of layers less than that of the polycrystalline member 112 or a single-layer structure. The textured member 116 also may have a multilayer structure with the number of layers less than that of the polycrystalline member 112 or a single-layer structure.

As an example, the single crystal member 114 may be provided in a single-layer structure to be disposed on the other end of the piezoelectric member 110, and the textured member 116 may be provided in a multilayer structure to be disposed adjacent to the other end of the piezoelectric member 110. Accordingly, the polycrystalline member 112 may occupy most of the entire area of the piezoelectric member 110, and the single crystal member 114 and the textured member 116 may occupy the relatively small area as one-side end of the piezoelectric member 110. For example, the polycrystalline member 112 may occupy about 90% of the entire area of the piezoelectric member 110, more preferably more than 95%.

The connection member 120, which is a portion bonded to the single crystal member 114 of the piezoelectric member 110, may be a portion for coupling the piezoelectric member 110 to another object (not shown). As an example, the connection member 120 may be various types of electrical device. As another example, the connection member 120 may be a non-electrical structure.

Meanwhile, usually, the single crystal piezoelectric material, which forms the single crystal member 114, is resistant to external shocks due to very high mechanical strength compared to the polycrystalline piezoelectric material. However, the single crystal piezoelectric material is relatively very expensive compared to the polycrystalline piezoelectric material. Accordingly, when manufacturing the entire piezoelectric member with the single crystal piezoelectric material, since manufacturing costs of the piezoelectric device 100 are very high, it may be preferred in terms of manufacturing costs that the single crystal member 114 is provided to occupy the minimum area in the entire area of the piezoelectric member 110. On the contrary, usually, since the polycrystalline piezoelectric material is easily damaged by external shocks due to low mechanical strength compared to the single crystal piezoelectric material, it is vulnerable to physical or mechanical shocks. Therefore, considering the above-described characteristics comprehensively, when the area of the piezoelectric member 110 on which external physical or mechanical shocks are concentrated is manufactured with the single crystal member 114, and the other area is manufactured with the polycrystalline member 114, it is possible to implement the piezoelectric device 100 that can satisfy both of price and reliability against external shocks.

In order to satisfy the above characteristics, the area adjacent to the bonding portion between the piezoelectric member 110 and the connection member 120 on which external shocks are concentrated may be manufactured with the single crystal piezoelectric material 114. The single crystal member 114 may be provided in a single-layer structure to minimize price rises due to the use of the single crystal member 114. And the area except the single crystal member 114 may be provided as a lamination structure of the polycrystalline member 112. Here, the textured member 116 may be an area formed since the piezoelectric material of the polycrystalline member 112 adjacent to the single crystal member 114 has a much higher crystallinity in the predetermined displacement direction of crystal orientation than a typical polycrystalline piezoelectric material when firing the laminated piezoelectric consisting of the polycrystalline member 112 and the single crystal member 114 in the manufacturing process of the piezoelectric member 110. If the desired displacement direction of the piezoelectric device 100 is d33, the textured member 116 may be a high performance piezoelectric area having a crystal orientation of d33 by performing the firing process on the laminated single crystal and polycrystalline piezoelectric members after disposing the single crystal member 114 to have a crystal orientation of d33.

Continuously, various embodiments of a driven assembly with the above-described piezoelectric device 100 will be described. Here, descriptions overlapping with those of the above-described piezoelectric device 100 will be omitted or simplified.

Figure 2A:
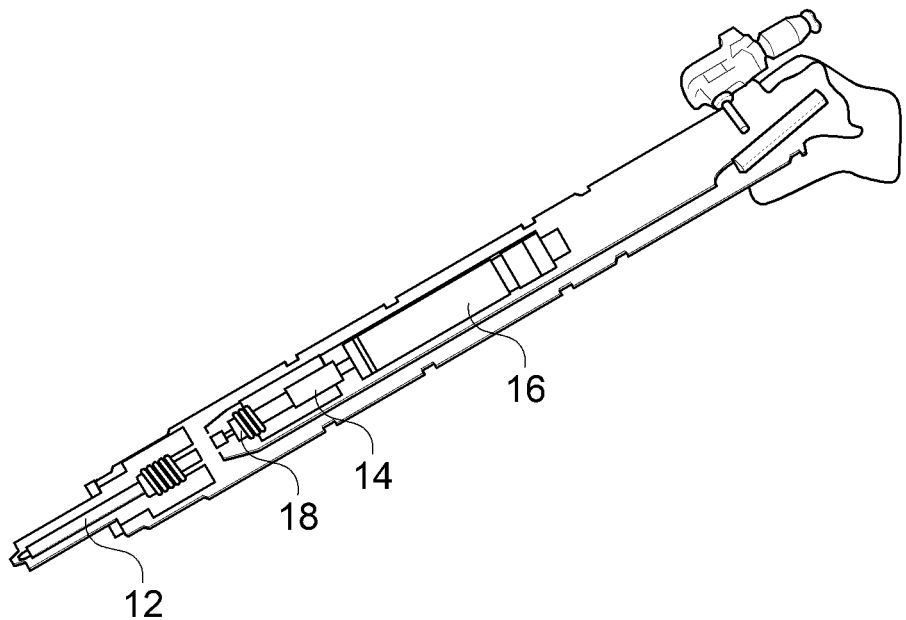
FIG. 2a is a view showing an example of a driven assembly with the piezoelectric device of FIG. 1.

FIG. 2a is a view showing an example of the driven assembly with the piezoelectric device of FIG. 1. Referring to FIG. 2, the piezoelectric device 100 according to an embodiment of the present invention may be provided in a fuel injector 10 as an example of the driven assembly. More specifically, the fuel injector 10 may consist of a nozzle member 12, a coupling member 14, and a driving member 16. The nozzle member 12 may discharge fuel to the outside, and the coupling member 14 may transmit a driving force of the driving member 16 to a control valve 18 that controls the nozzle member 12. Here, the driving member 16 may be coupled to the coupling member 14 and have the piezoelectric device 100 of FIG. 1 that controls driving of the control valve 18. A piezoelectric member 110 of the piezoelectric device 100 may adjust a crystal orientation thereof in correspondence to the fuel discharge direction of the nozzle member 12.

Figure 2B:
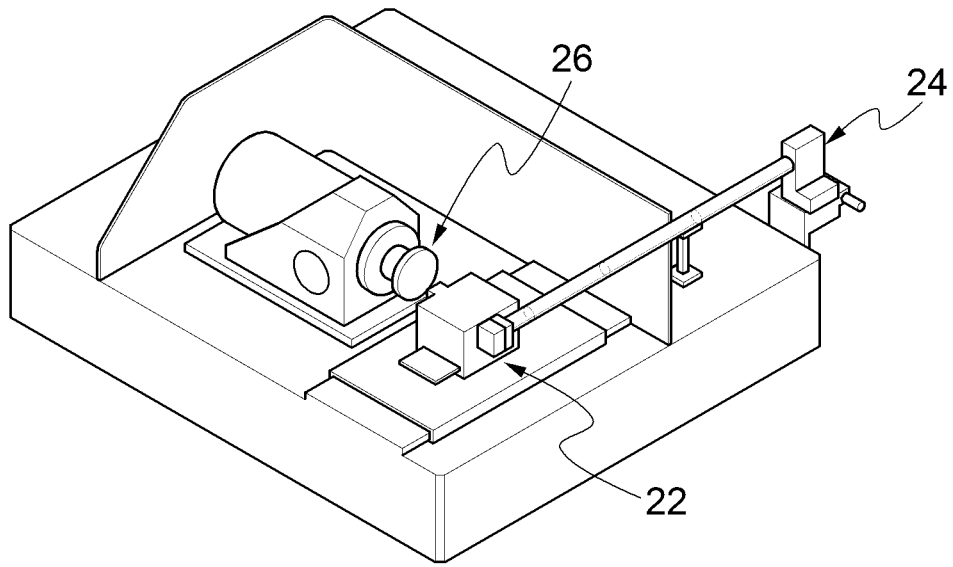
FIG. 2b is a view showing another example of the driven assembly with the piezoelectric device of FIG. 1.

FIG. 2b is a view showing another example of the driven assembly with the piezoelectric device of FIG. 1. Referring to FIG. 2b, the piezoelectric device 100 according to an embodiment of the present invention may be provided in a nano-positioning apparatus 20 as another example of the driven assembly. The nano-positioning apparatus 20, which is an apparatus for changing an ultra-fine position, may be used in a microscope etc. The nano-positioning apparatus 20 may finely move a workpiece 26 by the piezoelectric device 100 while sensing the position of the moving object by a sensing member 24 by including a driving unit 22 to which the piezoelectric device 100 of FIG. 1 is applied.

As described above, the piezoelectric device 100 according to an embodiment of the present invention consists of the piezoelectric member 110 and the connection member 120 which are coupled to each other, wherein the piezoelectric member 110 may have a composite piezoelectric structure in which the polycrystalline member 112 made of a relatively inexpensive polycrystalline piezoelectric material occupies most of the piezoelectric member 110 and the single crystal member 114 made of a single crystal piezoelectric material relatively resistant to external shocks occupies only the portion coupled to the connection member 120. In this case, the piezoelectric member 110 can minimize costs due to the use of the single crystal piezoelectric material while being resistant to external shocks by implementing the coupling portion between the piezoelectric member 110 and the connection member 120 on which external shocks are concentrated with the single crystal member 114 and implementing the remaining portion with the polycrystalline member 112. Accordingly, the piezoelectric device and the driven assembly with the same according to the present invention can minimize a rise in manufacturing costs while being resistant to external shocks by implementing most of the piezoelectric member with a relatively inexpensive polycrystalline piezoelectric material and implementing the bonding portion with the connection member on which external shocks are concentrated with the single crystal member having high strength.

Hereinafter, a method for manufacturing a piezoelectric device in accordance with an embodiment of the present will be described in detail. Here, descriptions overlapping with those of the above-described piezoelectric device 100 will be omitted or simplified.

Figure 3:
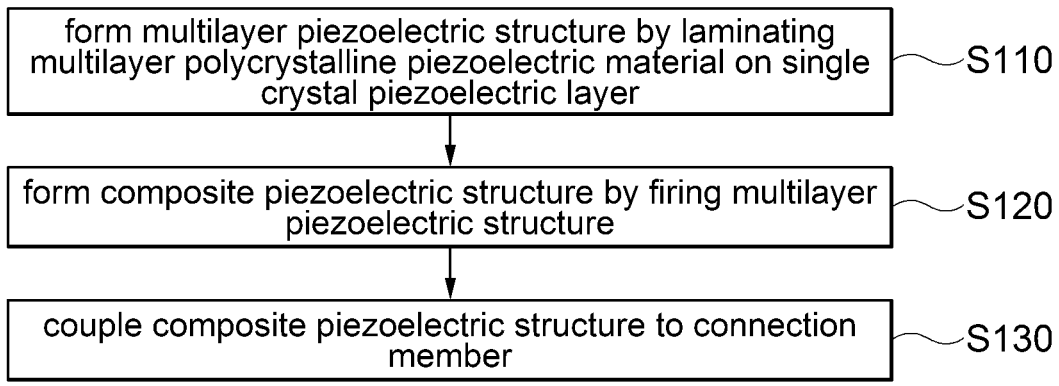
FIG. 3 is a flowchart showing a method for manufacturing a piezoelectric device in accordance with an embodiment of the present invention.
Figure 4A:
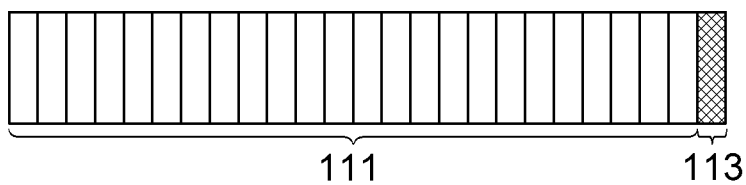
FIGS. 4a to 4c are views for explaining a process of manufacturing a piezoelectric device in accordance with an embodiment of the present invention.
Figure 4B:
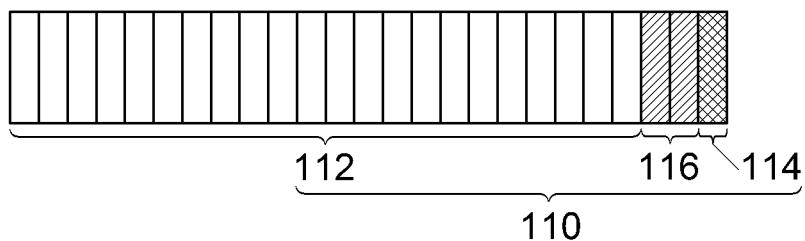
Figure 4C:
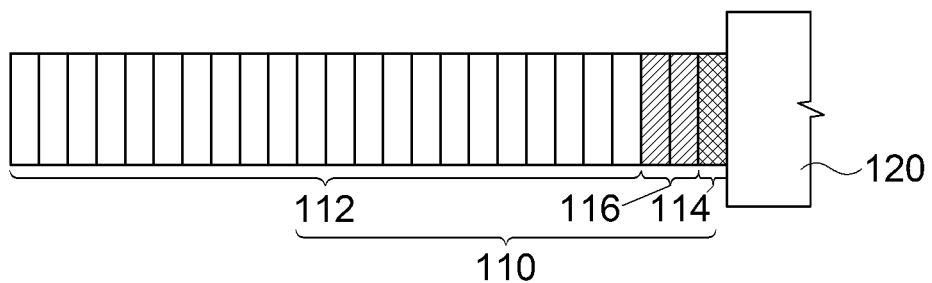

FIG. 3 is a flowchart showing a method for manufacturing a piezoelectric device in accordance with an embodiment of the present invention, and FIGS. 4a to 4c are views for explaining a process of manufacturing a piezoelectric device in accordance with an embodiment of the present invention.

Referring to FIGS. 3 and 4a, a multilayer piezoelectric structure 101 may be formed by laminating a multilayer polycrystalline piezoelectric material 111 on a single crystal piezoelectric layer 113 (S110). More specifically, the multilayer polycrystalline piezoelectric material 111 may be prepared. The multilayer polycrystalline piezoelectric material 111 may be prepared by manufacturing a plurality of green sheets using a polycrystalline piezoelectric material and laminating the green sheets. The single crystal piezoelectric layer 113 may be prepared by forming a single-layer piezoelectric layer having a single piezoelectric crystal phase.

Here, the multilayer polycrystalline piezoelectric material 111 may be prepared in a non-sintered state in which sintering is not completed, and the single crystal piezoelectric layer 113 may be prepared in a sintered state in which sintering is completed. Since the crystal phase of the single crystal piezoelectric layer 113 is predetermined, the single crystal piezoelectric layer 113 may be aligned so that the crystal orientation of the piezoelectric material thereof is d33. And the multilayer polycrystalline piezoelectric material 111 may be laminated on the single crystal piezoelectric layer 113. Accordingly, as shown in FIG. 4a, the multilayer piezoelectric structure 101, which consists of the non-sintered multilayer polycrystalline piezoelectric material 111 and the sintered single crystal piezoelectric layer 113, can be manufactured.

Referring to FIGS. 3 and 4b, a composite piezoelectric structure 103 may be formed by firing the multilayer piezoelectric structure 101 (S120). The step of performing the firing process may perform heat treatment on the multilayer piezoelectric structure 101 at a predetermined heating temperature so that the above-described multilayer piezoelectric structure 101 can be implemented into the composite piezoelectric structure 103 consisting of a polycrystalline member 112, a single crystal member 114, and a textured member 116. Through the firing process, the textured member 116 having intermediate properties of the polycrystalline piezoelectric material and the single crystal piezoelectric material by changing some areas of the polycrystalline piezoelectric material 111 adjacent to the single crystal piezoelectric layer 113 close to the crystal orientation of the single crystal piezoelectric material. Accordingly, the composite piezoelectric structure 103 consisting of the polycrystalline member 112, the single crystal member 114, and the textured member 116 can be formed.

Referring to FIGS. 3 and 4c, the composite piezoelectric structure 103 may be coupled to a connection member 120 (S130). The connection member 120 may be various types of electrical devices or non-electrical components. Accordingly, a piezoelectric device 100 of FIG. 1 having a coupling structure of the piezoelectric member 110 and the connection member 120 can be manufactured by connecting the composite piezoelectric structure 103 and the connection member 120 through the single crystal member 114. Meanwhile, the piezoelectric device 100 may be provided in various types of driven assemblies such as a fuel injector 10 and a nano-positioning apparatus 20 shown in FIG. 2.

As described above, the method for manufacturing a piezoelectric device in accordance with an embodiment of the present invention can manufacture a piezoelectric device by firing a laminate of a multilayer polycrystalline piezoelectric layer and a single-layer single crystal piezoelectric layer to form a piezoelectric member having a composite structure of a polycrystalline piezoelectric material and a single crystal piezoelectric material while allowing the relatively inexpensive polycrystalline piezoelectric material to occupy most of the piezoelectric member and allowing the single crystal piezoelectric material, which is relatively resistant to external shocks, to form a coupling portion of the piezoelectric member and a connection member on which external shocks are concentrated. Accordingly, the method for manufacturing a piezoelectric device in accordance with the present invention can manufacture a piezoelectric device having a structure that minimizes a rise in manufacturing costs while being resistant to external shocks by manufacturing the piezoelectric member to have the composite structure of the polycrystalline piezoelectric material and the single crystal piezoelectric material while manufacturing most of the piezoelectric member with the relatively inexpensive polycrystalline piezoelectric material and manufacturing only the portion bonded to the connection member on which external shocks are concentrated with the single crystal member having high strength.

The piezoelectric device and the driven assembly with the same in accordance with the present invention can minimize a rise in manufacturing costs while being resistant to external shocks by configuring a piezoelectric member of the piezoelectric device in a composite structure of a polycrystalline piezoelectric material and a single crystal piezoelectric material while implementing most of the piezoelectric member with the relatively inexpensive polycrystalline piezoelectric material and implementing a portion bonded to a connection member on which external shocks are concentrated with a single crystal member.

The method for manufacturing a piezoelectric device in accordance with the present invention can manufacture a piezoelectric device having a structure that minimizes a rise in manufacturing costs while being resistant to external shocks by manufacturing a piezoelectric member to have a composite structure of a polycrystalline piezoelectric material and a single crystal piezoelectric material while manufacturing most of the piezoelectric member with the relatively inexpensive polycrystalline piezoelectric material and manufacturing only the portion bonded to a connection member on which external shocks are concentrated with a single crystal member having high strength.

The foregoing description illustrates the present invention. Additionally, the foregoing description shows and explains only the preferred embodiments of the present invention, but it is to be understood that the present invention is capable of use in various other combinations, modifications, and environments and is capable of changes and modifications within the scope of the inventive concept as expressed herein, commensurate with the above teachings and/or the skill or knowledge of the related art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A piezoelectric device comprising:
a piezoelectric member; and
a connection member coupled to the piezoelectric member, wherein the piezoelectric member comprises:
a polycrystalline member made of a polycrystalline piezoelectric material;
a single crystal member made of a single crystal piezoelectric material and coupled to the connection member; and
a textured member provided between the polycrystalline member and the single crystal member and having intermediate properties of the polycrystalline piezoelectric material and the single crystal piezoelectric material.

2. The piezoelectric device according to claim 1, wherein the polycrystalline member has a multilayer structure with the number of layers greater than those of the single crystal member and the textured member.

3. The piezoelectric device according to claim 1, wherein the single crystal member has a single-layer structure, and the polycrystalline member has a multilayer structure.

4. The piezoelectric device according to claim 1, wherein the polycrystalline member occupies more than 90% of the entire area of the piezoelectric member.

5. The piezoelectric device according to claim 1, wherein the textured member has a crystal orientation closer to that of the single crystal member than that of the polycrystalline piezoelectric material.

6. The piezoelectric device according to claim 1, wherein the single crystal member has a crystal orientation of d33, and the textured member has a crystal orientation closer to that of d33 than that of the polycrystalline member.

7. The piezoelectric device according to claim 1, wherein the textured member is formed by disposing the polycrystalline piezoelectric material adjacent to the single crystal member and firing the polycrystalline piezoelectric material to change the crystal orientation of the polycrystalline piezoelectric material adjacent to the single crystal member.

* * * * *